(12) United States Patent
Mueller

(10) Patent No.: US 7,276,895 B2
(45) Date of Patent: Oct. 2, 2007

(54) ADJUSTABLE TEST HEAD DOCKING APPARATUS

(75) Inventor: Christian Mueller, Rosenhein (DE)

(73) Assignee: inTEST Corporation, Cherry Hill, NJ (US)

( * ) Notice: Subject to any disclaimer, the term of this patent is extended or adjusted under 35 U.S.C. 154(b) by 3 days.

(21) Appl. No.: 10/678,691

(22) Filed: Oct. 3, 2003

(65) Prior Publication Data

US 2005/0073296 A1    Apr. 7, 2005

(51) Int. Cl.
*G01R 31/28* (2006.01)
(52) U.S. Cl. .................................................. 324/158.1
(58) Field of Classification Search ........ 324/754–758, 324/765, 158.1
See application file for complete search history.

(56) References Cited

U.S. PATENT DOCUMENTS

| | | | |
|---|---|---|---|
| 4,993,136 A * | 2/1991 | Kerschner et al. | 29/401.1 |
| 5,295,853 A * | 3/1994 | Nagakusa et al. | 439/330 |
| 6,218,910 B1 * | 4/2001 | Miller | 333/33 |
| 6,586,925 B2 * | 7/2003 | Ramesh et al. | 324/158.1 |
| 6,836,109 B2 * | 12/2004 | Thurmaier | 324/158.1 |
| 6,836,110 B1 * | 12/2004 | Ha et al. | 324/158.1 |

* cited by examiner

*Primary Examiner*—Jermele Hollington
(74) *Attorney, Agent, or Firm*—RatnerPrestia

(57) ABSTRACT

Provided is an apparatus for establishing a distance between a test head and a peripheral. The apparatus includes a frame to which one of either a test head or a peripheral is docked. The frame has a linear unit which moves the frame towards or away from a docking surface of either the test head or the peripheral.

24 Claims, 18 Drawing Sheets

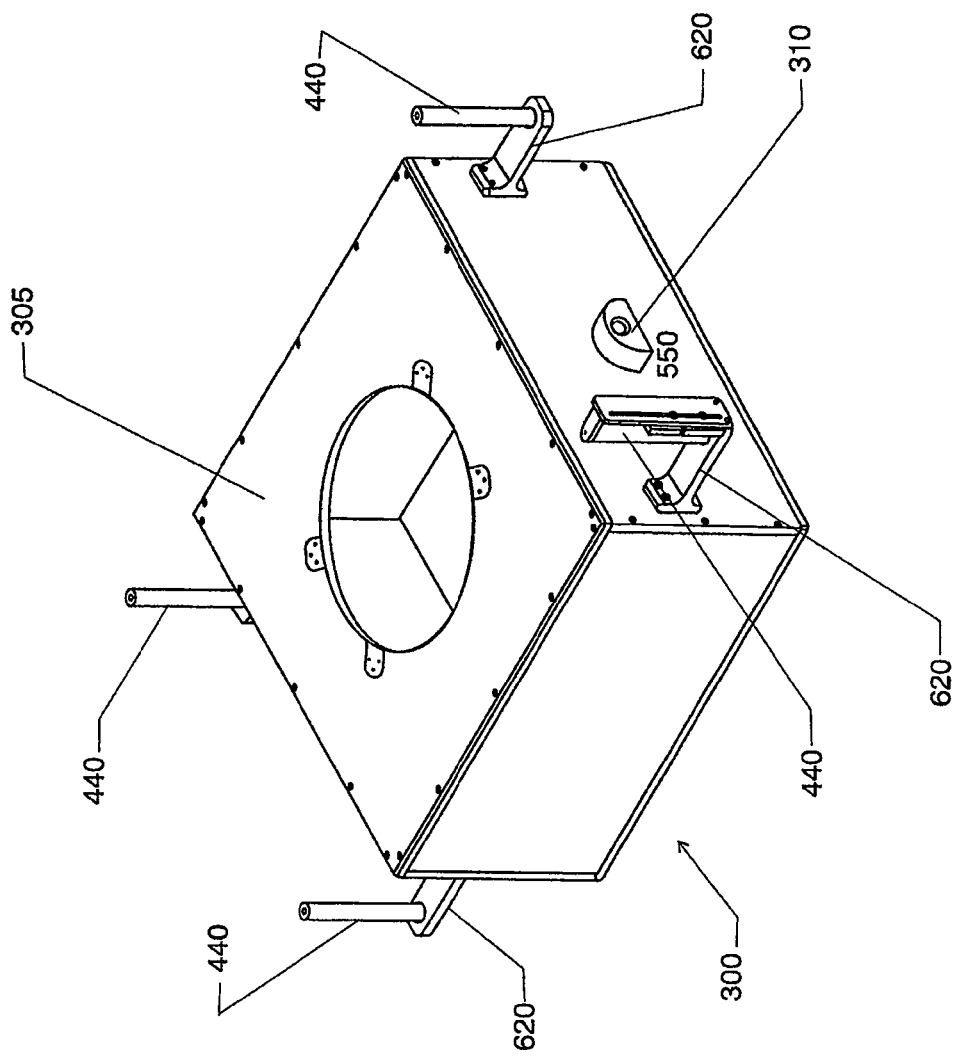

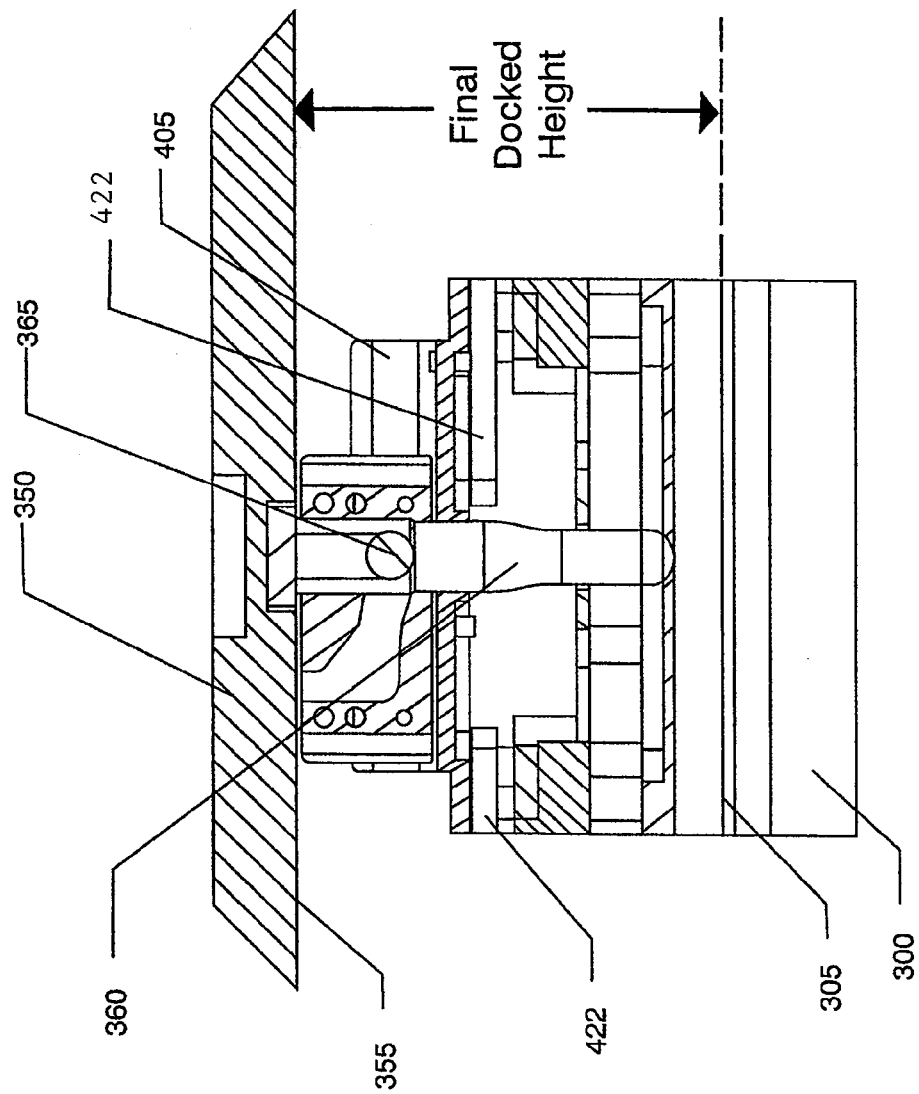

ADJUSTABLE TEST HEAD DOCKING APPARATUS

FIELD OF THE INVENTION

This invention relates to the field of art of electronic test head docking apparatus, and more specifically, to an apparatus for establishing a distance between a test head and a peripheral.

BACKGROUND OF THE INVENTION

In the manufacture of integrated circuits (ICs) and other electronic devices, testing with automatic test equipment (ATE) is performed at one or more stages of the overall process. A special handling apparatus is used to place the device under test ("DUT") into position for testing. In some cases, the special handling apparatus may also bring the DUT to the proper temperature and/or maintain it at the proper temperature to be tested. The special handling apparatus is of various types including "probers" for testing unpackaged devices on a wafer and "device handlers" for testing packaged parts; herein, "peripheral" or "peripherals" will be used to refer to all types of such apparatus. The electronic testing itself is provided by a large and expensive ATE system. The DUT requires precision, high-speed signals for effective testing; accordingly, the "test electronics" within the ATE, which are used to test the DUT, are typically located in the test head, which must be positioned as close as possible to the DUT. The test head is extremely heavy; the size and weight of the test heads have grown from a few hundred pounds to as much as three to four thousand pounds.

In order to use a test head to test integrated circuits, the test head is typically "docked" to a peripheral. When docked, the test head must be located as close as possible to the peripheral's test site in order to minimize signal degradation. A test head positioning system may be used to position the test head with respect to the peripheral and may be designed to facilitate flexible docking and undocking of a test head with a variety of peripherals. A test head positioning system may also be referred to as a test head positioner or test head manipulator. Test head positioning systems have been described in numerous patents, and certain patents of interest will be mentioned later.

Docking is well known and documented in the patent literature. For example, U.S. Pat. No. 4,589,815 (Smith) describes an early docking system whose principles are still in general use. Additionally, WIPO International Publications WO 03/008984 A2 (Gudin et al), WO 02/25292 A2 (Ny et al) and WO 01/64389 A2 (Holt et al), provide more general discussions of contemporary docking and include several further references. Some pertinent concepts are summarized where appropriate in the following discussions.

It is often desirable to dock a given test head with different peripherals from time to time. For example, testing may be performed with a certain packaged device handler for a time, and then it may be desired to change to another packaged device handler. In other situations, it may be desired to change between a wafer prober and a packaged device handler. In such cases the test head is undocked from the original peripheral which is then moved out of the way. The new peripheral is then moved into place, and the test head is docked with it. Also, it is often desirable to move the test head away from a peripheral to perform maintenance. Thus, it may be required to easily dock and undock the test head with a variety of different peripherals.

An electrical interface apparatus is also provided to enable electrical signals, grounds, and power to be passed between the test electronics and the DUT. Typically a portion of the interface is coupled to the peripheral and the remaining portion is coupled to the test head. Electrical contacts are disposed on each side of the interface. The interface may include hundreds or thousands of electrical contacts, which are of necessity small and fragile. Typically, the contacts are arranged in a generally planar fashion on each side of the interface. When the test head is docked, electrical connections are thus made between corresponding contacts on the two sides of the interface. It is well understood that in docking the test head must first be planarized with respect to the interface, aligned linearly in two dimensions, and aligned rotationally about an axis perpendicular to the plane of the interface. The test head may then be advanced along a linear path into a docked position. The docking apparatus must provide a means to establish the final docked distance (or "height") between the test head and the peripheral such that the electrical contacts are satisfactorily mated (that is, with sufficient compression, scrub, etc. to assure a low resistance connection) and such that the test head does not over-travel and thus damage or destroy the contacts. It is typical that interfaces will be changed when operation is switched from one peripheral to another. Further, it is typical that when a single peripheral is used to first test devices of one type and then reconfigured to test devices of another type, the interface is changed from a first type to a second type. Generally, the docked height requirement may be different for each testing set up.

The test head positioning system is a mechanical device that allows an operator to bring an automatic test equipment test head, which may weigh close to three to four thousand pounds, into proximity with a peripheral and to allow the test head to be docked with it. When the test head is docked with the peripheral, the hundreds or thousands of delicate electrical contacts must be precisely aligned and mated to enable testing signals, grounds and power to be transferred between the DUT and the test head. The size, weight, number and resiliency of the cables that connect the test head to the automatic test equipment have correspondingly increased. The resultant effect of these factors have made it increasingly difficult to bring a heavy test head into contact with a peripheral with the precision needed to mate hundreds or thousands of individual delicate electrical contacts without damaging them.

Furthermore, although there have been limited attempts to provide multiple-height docking apparatus that allows the docked height to be adjusted or selected, it is presently customary to use single-height docking apparatus having a single, built in docking height. This is because the mechanisms employed in multiple-height docks have proven to be limited in operation or difficult to effectively operate. Typically single-height docks are specifically designed for each user application. Thus, when changing over from one testing set up to another it has become necessary to change docking apparatus. Also the cost and storage requirements for a large number of docking apparatuses can become appreciable.

These factors have created demand for test head positioning systems with an increased load carrying capacity, increased flexibility in carrying different peripheral devices and increased protection from damaging the fragile electrical connections.

SUMMARY OF THE INVENTION

Provided is an apparatus for establishing a distance between a test head and a peripheral. The apparatus includes a frame to which one of either a test head or a peripheral is docked. The frame has a linear unit which moves the frame towards or away from a docking surface of either the test head or the peripheral.

BRIEF DESCRIPTION OF THE DRAWINGS

FIG. 6 is a perspective view of mounting brackets for mounting the U-frame of FIG. 3 attached to a test head.

FIG. 17 is an enlarged cut-away side view along line 13-13 of FIG. 12 showing an alignment feature and a cam assembly in a docked position.

DETAILED DESCRIPTION OF THE INVENTION

In an exemplary embodiment, the present invention provides an apparatus for docking an electronic test head with a peripheral device. An assembly is provided for bringing together an electronic test head and a peripheral. A peripheral mounting plate, attached to the peripheral, docks with a U-frame mounted to the test head.

A plurality of alignment features having cam followers are situated on the peripheral mounting plate. A plurality of linear cams are situated on the U-frame. Each of the linear cams are aligned to receive the alignment features. Once mated, the peripheral docking plate is placed into the docked position by sliding the linear cam along cam guides. As a result of the sliding movement, the cam followers of the alignment features are guided along a slotted track within the linear cams thereby drawing the peripheral plate into the final docked position.

Figure 1:
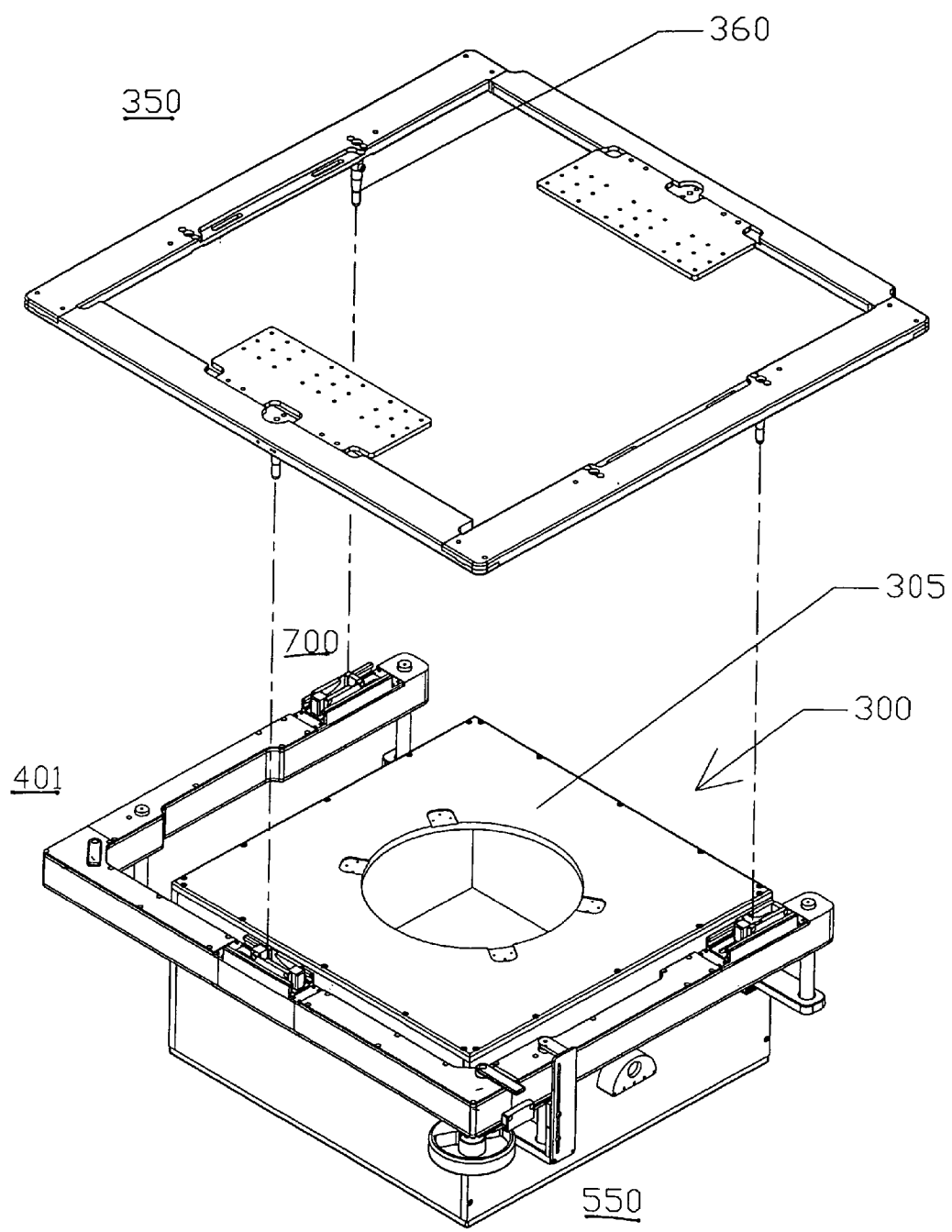
FIG. 1 is a perspective view of an embodiment of the present invention showing a peripheral docking plate and a U-frame mounted on a test head.

FIG. 1 is a perspective view of a test head and docking apparatus in accordance with an exemplary embodiment of the present invention. FIG. 1 shows peripheral docking plate 350 and U-frame 401, which is coupled to test head 300. A plurality of cam assemblies 700 and index system 550 are coupled to U-frame 401. In this exemplary embodiment, there are three cam assemblies 700 and one index system 550. Peripheral docking plate 350 includes a plurality of alignment features 360. In this exemplary embodiment, three alignment features 360 are shown. Alignment features 360 and cam assemblies 700 are positioned so that alignment features 360 align with and mate with the respective cam assemblies 700.

U-frame 401 can move relative to the docking surface 305 of test head 300 by way of linear units. U-frame 401 is positioned to assure satisfactory mating of the interface contacts and to prevent the peripheral from destroying the delicate electrical connections. The ability of one or more components responsible for the movement of U-frame 401 relative to test head 305 allows the present invention to be utilized with a variety of peripherals, interfaces, and DUT's.

Figure 2:
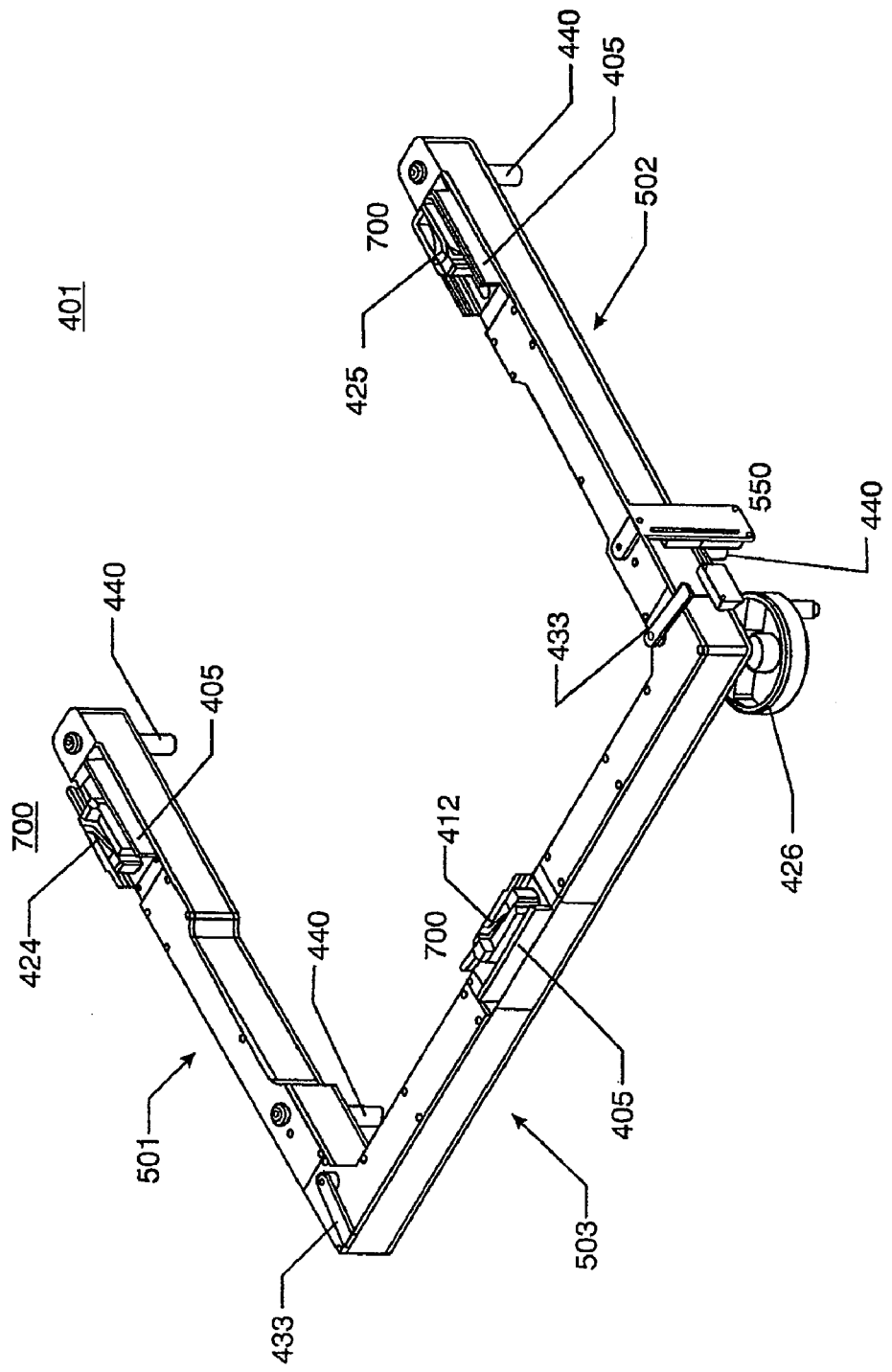
FIG. 2 is a detailed perspective view of the U-frame shown in FIG. 1.

FIG. 2 is a detailed perspective view of the U-frame 401 as shown in FIG. 1. U-frame 401 includes a left arm 501, a right arm 502 and a center brace 503. One end of left arm 501 is coupled to the left end of center brace 503. At the other end of left arm 501 is mounted a cam assembly 700. Likewise, one end of right arm 502 is coupled to the right end of center brace 503. At the other end of right arm 502 is mounted another cam assembly 700. Center brace 503 also includes a cam assembly 700 disposed between its left and right ends. Cam assembly 700 includes linear cams and cam guides 405. Left arm 501 is coupled to left linear cam 424, right arm 502 is coupled with right linear cam 425 and center brace 503 is coupled with center cam 412. Cam assemblies 700 are positioned on the same face of U-frame 401 so as to receive alignment features 360 of peripheral docking plate 350. Also disposed on the same face of U-frame 401 as cam assemblies 700 according to the exemplary embodiment of the present invention as shown in FIG. 2, are docking actuation handles 433 mounted on the right and left ends of center brace 503. A plurality of threaded members 440 are fixedly mounted to test head 300 and they extend through both the aforementioned face and the opposite face of U-frame 401. In this exemplary embodiment there are four threaded members 440. A first threaded member 440 is located at the cam-end of left arm 501, a second is located at the center-brace-end of left arm 501, a third is located at the cam-end of right arm 502 and a fourth is located at the center-brace-end of right arm 502. Also mounted at the center-brace-end of right arm 502 is index system 550. Index system 550 will be discussed in more detail below.

Figure 3:
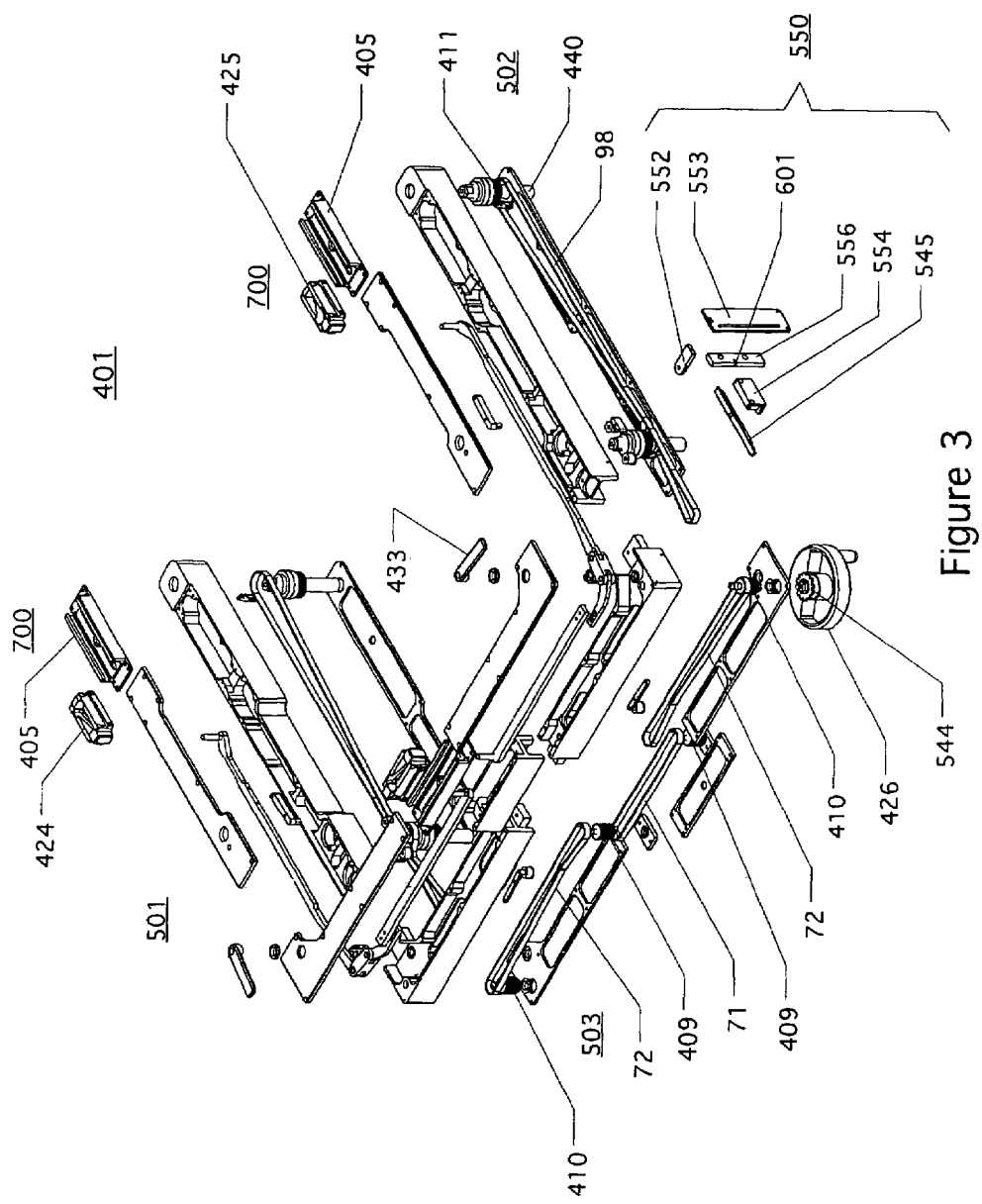
FIG. 3 is an exploded perspective view of the U-frame shown in FIG. 2.
Figure 4:
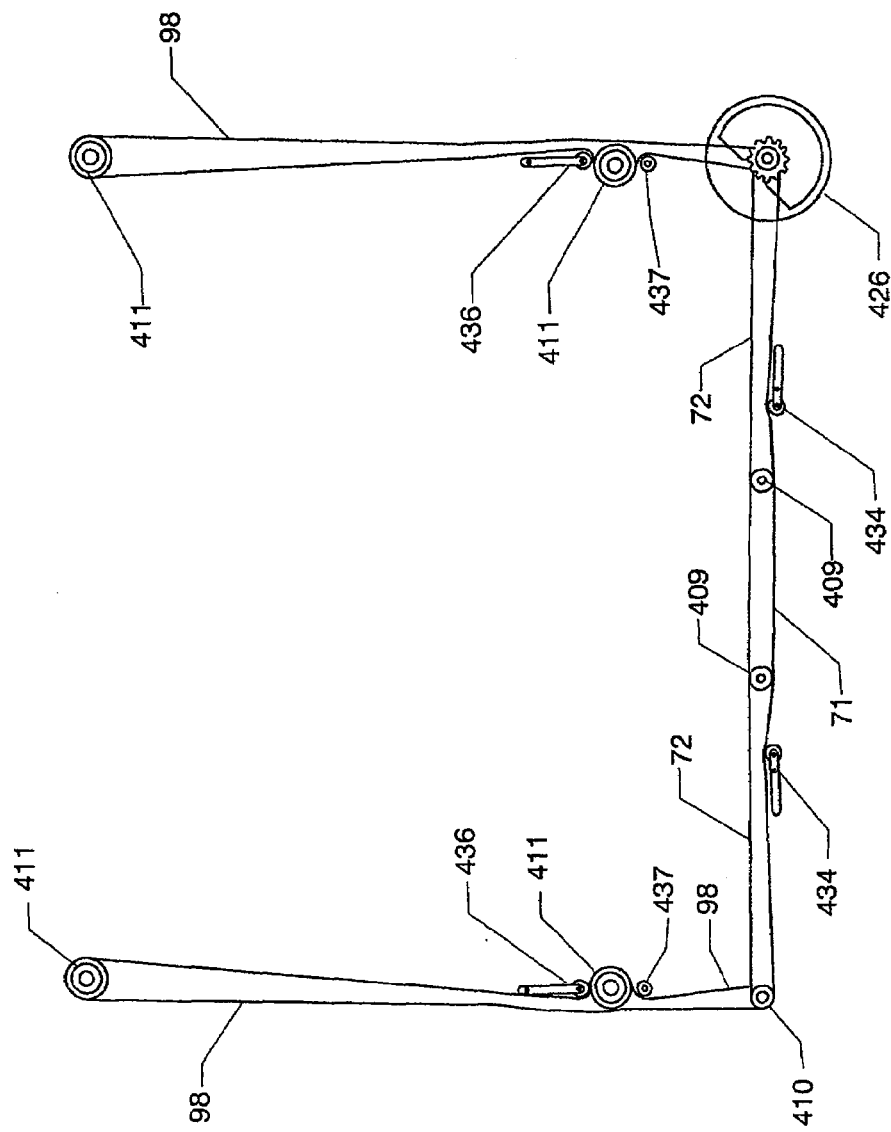
FIG. 4 is a top view of the pulley system contained in the U-frame shown in FIG. 3.
Figure 5A:
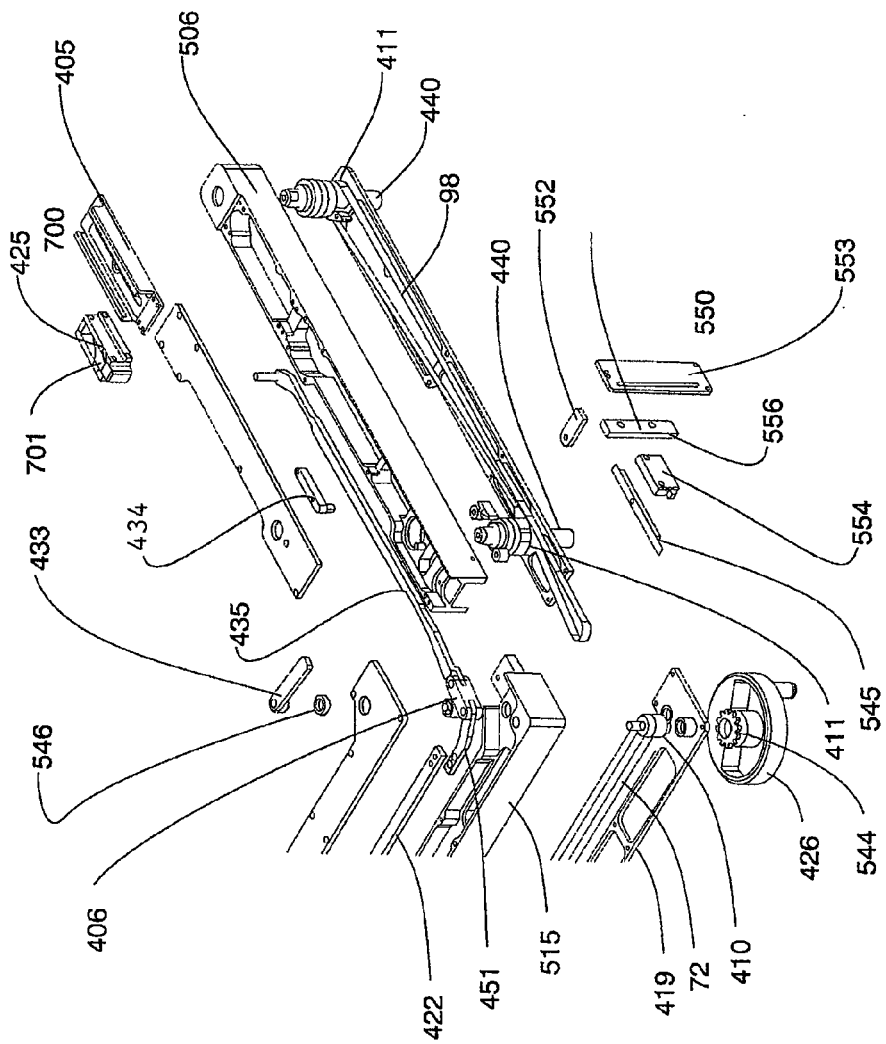
FIG. 5A is an exploded enlarged perspective view of a portion of the U-frame shown in FIG. 3.

FIG. 3 is an exploded perspective view and FIG. 5A is an enlarged exploded perspective view of U-frame 401 shown in FIG. 2. As discussed above, U-frame 401 is movable relative to test head 300. Exploded FIG. 3 helps to show how this movement is accomplished and enlarged FIG. 5A shows the mechanisms in more detail. FIG. 4 is a cut out, top view of a pulley system maintained inside U-frame 401 shown in FIG. 3 which is driven by crank 426. Crank 426 may be, for example, a hand wheel, a ratchet, or another type of electrical or pneumatic device. According to an exemplary embodiment of the present invention, the crank is hand wheel, which is coupled to dual pulleys 409 and 410. Dual pulleys 409 and 410 are connected by way of timing belts 71, 72 and 98, to other dual pulleys 410, which are coupled to drive nuts 411. Thus, as hand wheel 426 is rotated, all four drive nuts are rotated in synchronism. Threaded into drive nuts 411 are threaded members 440 (which make up linear units). FIG. 5A shows the relationship of drive nuts 411 to threaded members 440. Thus, as drive nuts 411 are rotated, they advance along their corresponding threaded members 440. Drive nuts 411 are captured within U-frame 401 so that as they advance along threaded members 440, U-frame 401 is caused to move with them. Thus, rotation of crank 426 causes U-frame 401 to move relative to test head 300.

Figure 8:
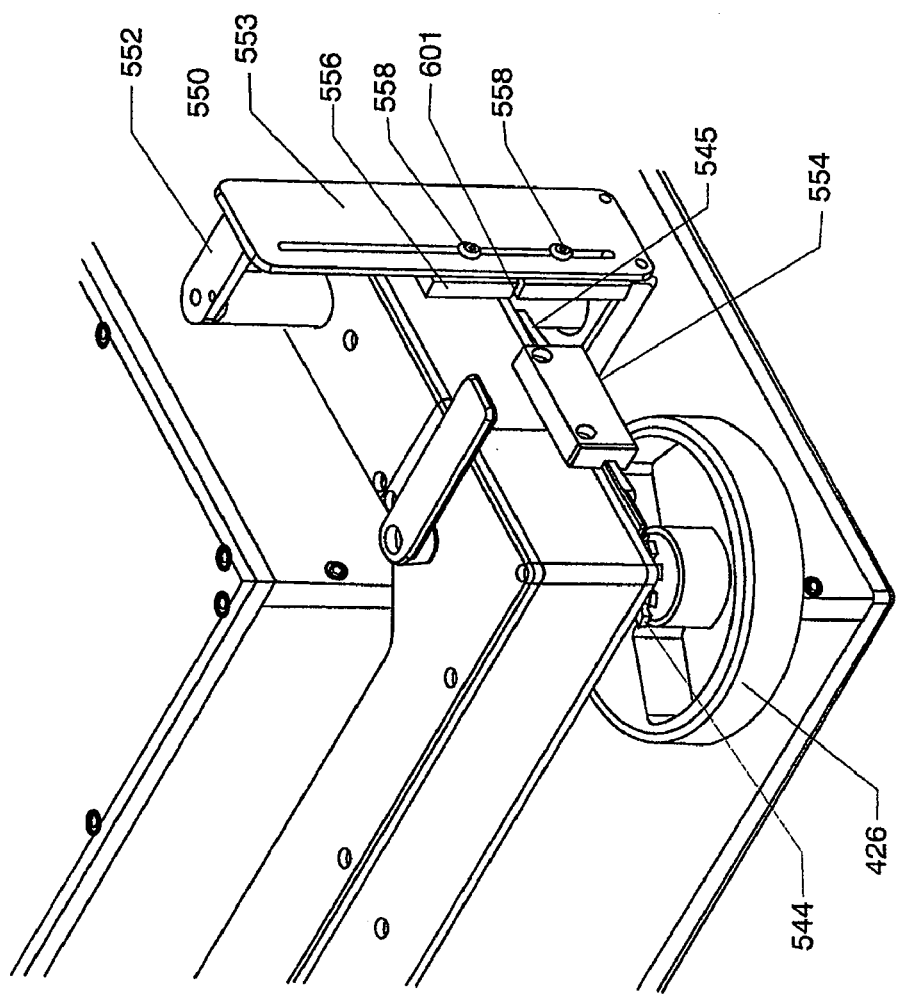
FIG. 8 is an enlarged perspective view of the entire index system of FIG. 7 at the index position.

FIG. 3 and FIG. 5A also show index system 550, and FIG. 8 shows it in further detail. Support bracket 552 is attached to one end of threaded member 440. The other end of support bracket 552 is coupled to slotted plate 553. Slotted plate 553 maintains detent plate 556 containing detent 601 by way of detent plate securing screws 558 (not included in FIGS. 3 and 5A, but shown in FIG. 8). Lever 545 is maintained on a pivot held by pivot mount 554. One end of lever 545 engages detent 601 and the other end engages sprocket wheel 544, discussed in more detail below.

Throughout this specification, indexed means that U-frame 401 has been set at a predetermined location compared to test head 300, and indexing means bringing U-frame 401 into such a position. In particular, when lever 545 engages detent 601 of detent plate 556 and sprocket wheel 544, crank 426 is prevented from turning; and U-frame 401 is unable to move along threaded members 440. U-frame 401 is thereby held in place. Because a variety of different peripherals and DUT's will be utilized with this invention, U-frame 401 can be set at a range of desired heights according to corresponding distances needed to allow for complete electrical contact between a test head and peripheral without passing beyond acceptable distances and damaging the fragile electrical connections. It is to be noted that indexing must be performed before docking. That is, docking should only be performed when U-frame 401 has been appropriately indexed.

Figure 5B:
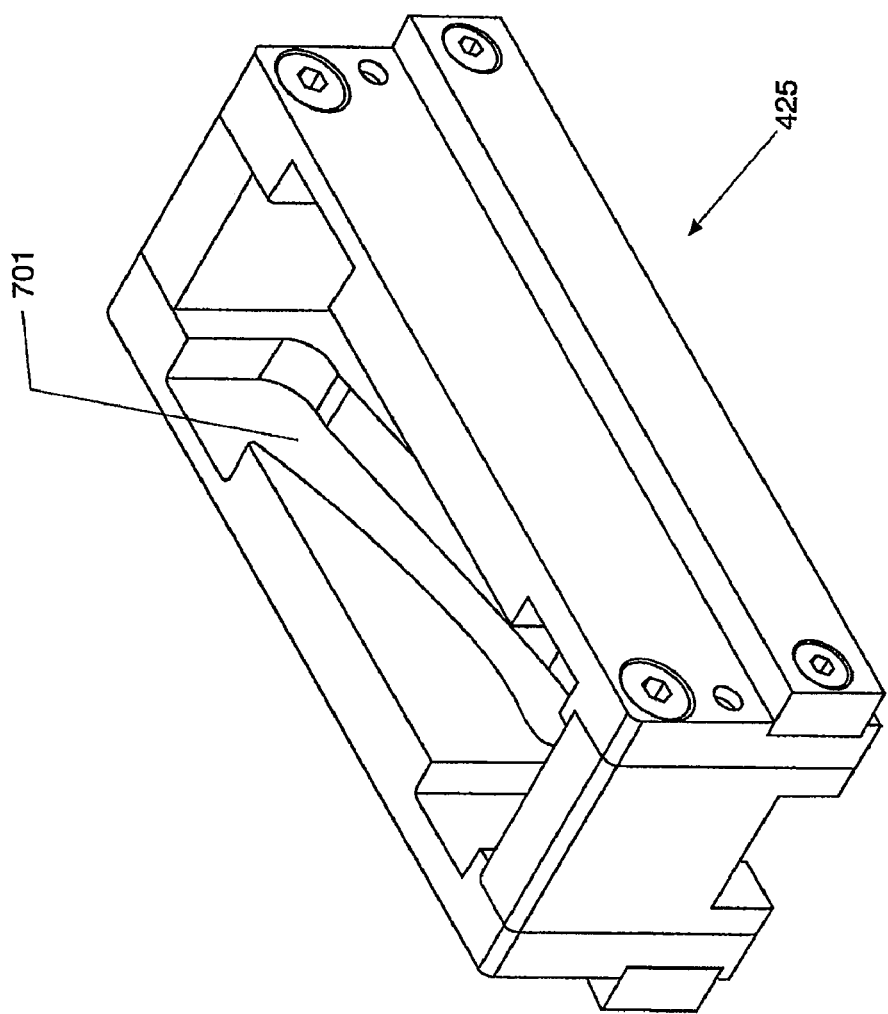
FIG. 5B is an enlarged perspective of a portion of a cam assemble as shown in FIG. 3.

FIGS. 3 and FIG. 5A are also helpful in explaining cam assembly 700. Cam assembly 700 includes a liner cam, which according to an exemplary embodiment of this invention, is either a right linear cam 425, a left linear cam 424, or a center cam 412. The linear cams are coupled to cam guide 405 and receive the alignment features 360 of peripheral docking plate 350. As can be seen in enlarged perspective view of FIG. 5B, angled cam groove 701 is designed to accept cam follower 365 of alignment feature 360.

FIG. 6 is a perspective view of test head 300 with the movable portions on the docking apparatus removed. Threaded members 440 are attached to test head 300 by means of mounting brackets 620. According to an exemplary embodiment of this invention as shown in FIG. 6, a pair of mounting brackets 620 are mounted to one side of test head 300, and a second pair of mounting brackets 620 is attached to the opposite side. Mounting brackets 620 extend perpendicularly outward from the side of test head 300. Coupled to mounting brackets 620 and extending essentially parallel with the sides of test head 300 are threaded members 440. Threaded members 440 are fixed so that they do not rotate. According to an exemplary embodiment of the present invention as shown in FIG. 6, one threaded member 440 may be coupled to index system 550 as is shown in more detail in FIG. 7.

Figure 7:
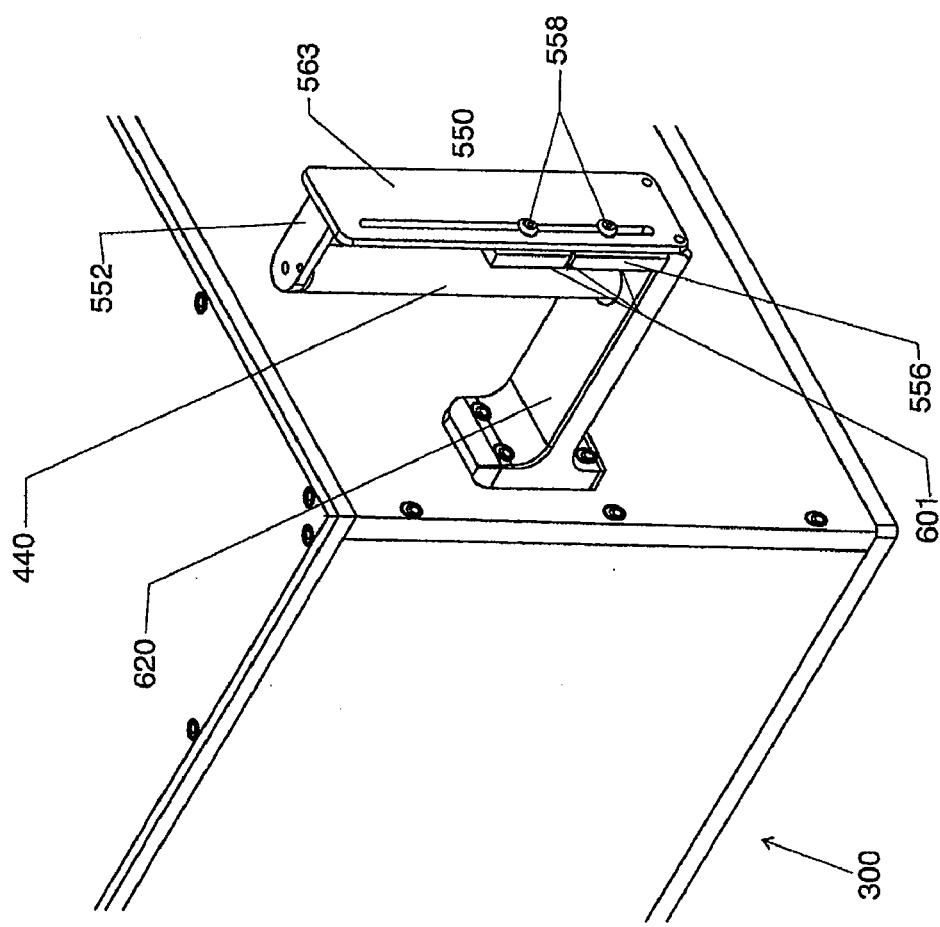
FIG. 7 is an enlarged perspective view of the portion of an index system attached to one of the mounting brackets as shown in FIG. 6.

FIG. 7 is an enlarged perspective view showing the portion of index system 550 that is coupled to mounting bracket 620 and threaded member 440 and, therefore, fixed to test head 300. Support bracket 552 is attached at one end to threaded member 440. The other end of support bracket 552 is coupled to one slotted plate 553. The opposite end of slotted plate 553 is attached to mounting bracket 620. Slotted plate 533 maintains detent plate 556 by way of detent plate securing screws 558. Detent plate 556 may have a plurality of detents 601. A plurality of detents 601 allows for different indexing positions, for example, one for receiving a prober and one for receiving a handler. In an exemplary embodiment in accordance with FIG. 7, detent plate 556 is shown with a single detent 601.

FIG. 8 is an enlarged perspective view of an embodiment of the test head positioning apparatus of the present invention at the index position. When the docking apparatus is at the indexed position, lever 545 engages the detent 601 at one end and sprocket wheel 544 at its other end.

Figure 9:
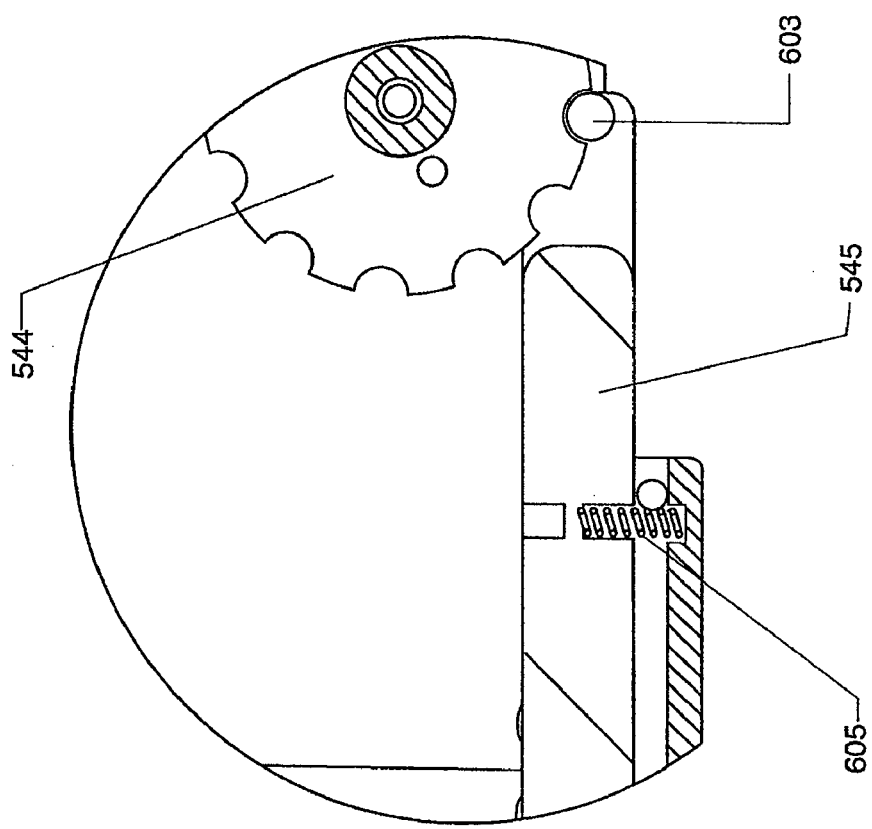
FIG. 9 is an enlarged view of a portion of a lever mechanism at the index position as shown in FIG. 8.

FIG. 9 is a cut-away, enlarged side view of the lever 545 at the index position as shown in FIG. 8 and described above. In FIG. 9, lever 545 engages sprocket wheel 544 by way of engaging pin 603. Spring 605 urges lever 545 towards detent 601 in detent plate 556. Because spring 605 maintains lever 545 in dent 601 and lever 545 is pivotally positioned at pivot block 554, engaging pin 603 attached to the other end of lever 545 engages sprocket wheel 544 preventing crank 426 (See FIG. 8) from turning. To disengage lever 545 from an indexed position, either lever 545 is drawn away from detent 601 or engaging pin 603 is drawn away from sprocket wheel 544.

Figure 10:
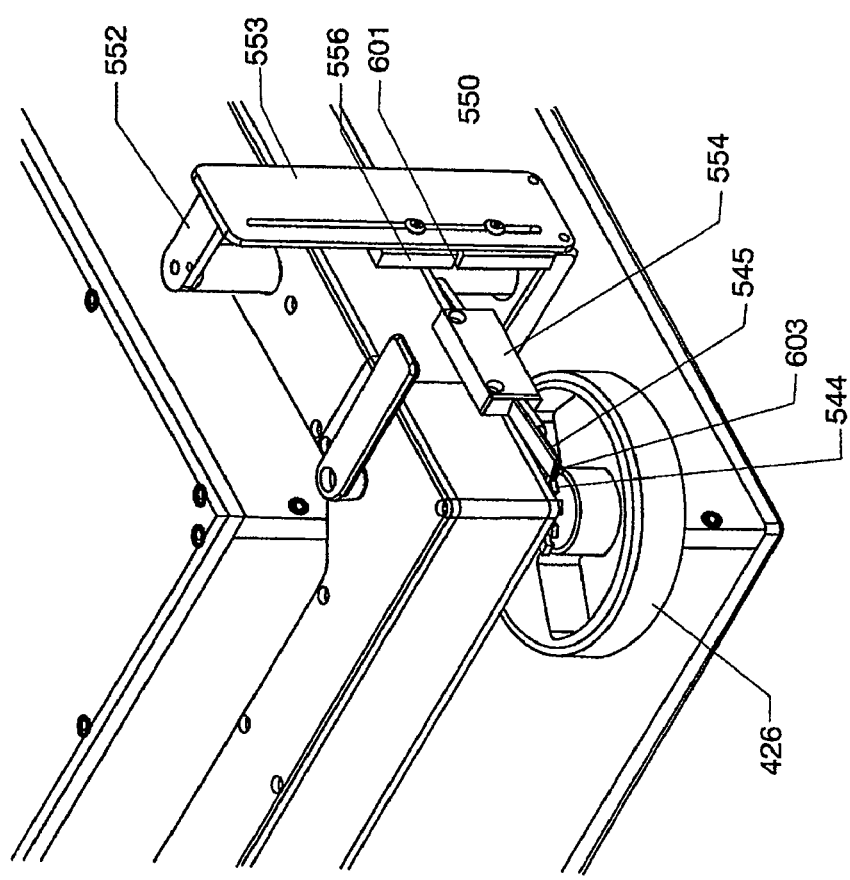
FIG. 10 is an enlarged perspective view of the index system above the index position as shown in FIG. 8.

FIG. 10 is an enlarged perspective view of U-frame 401 above the indexed position shown in FIG. 8. As can be seen in FIG. 10, lever 545 is not engaged in detent 601 of detent plate 556, nor is engaging pin 603 of the other end of lever 545 engaged in sprocket wheel 544. At the position shown in FIG. 10, hand wheel 426 is allowed to turn.

Figure 11:
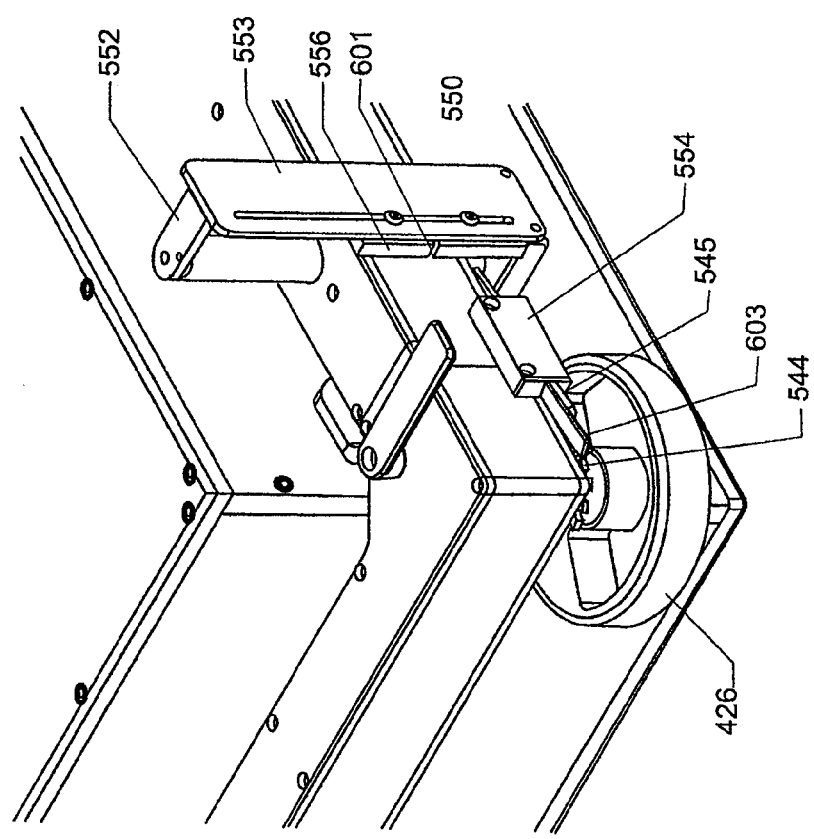
FIG. 11 is an enlarged perspective view of the index system below the index position as shown in FIG. 8.

Alternatively, FIG. 11 is an enlarged perspective view of U-frame 401 below the indexed position shown in FIG. 8. As can be seen in FIG. 11, lever 545 is not engaged in detent 601 of detent plate 556, nor is engaging pin 603 of the other end of level 545 engaged in sprocket wheel 544. At the position shown in FIG. 11, crank 426 is also allowed to turn.

Figure 12:
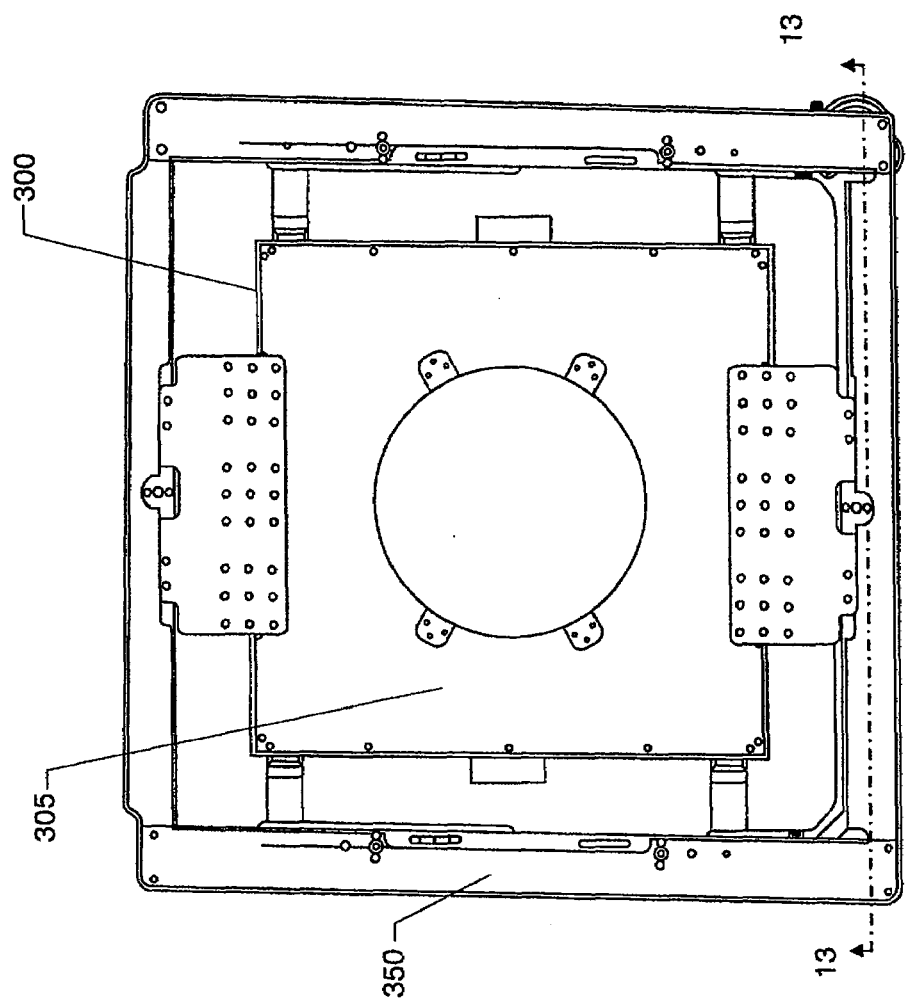
FIG. 12 is a top view of the peripheral docking plate docked to the U-frame attached to a test head as shown in FIG. 1.

FIG. 12 is a top view of the peripheral docking plate docked with U-frame 401, which is coupled to test head 300 as shown in FIG. 1. When peripheral docking plate 350 is mounted to a peripheral and docked to U-frame 401, the interface electrical contacts on the peripheral side come into precise electrical contact with the interface contacts on test head 300 side.

Figure 13:
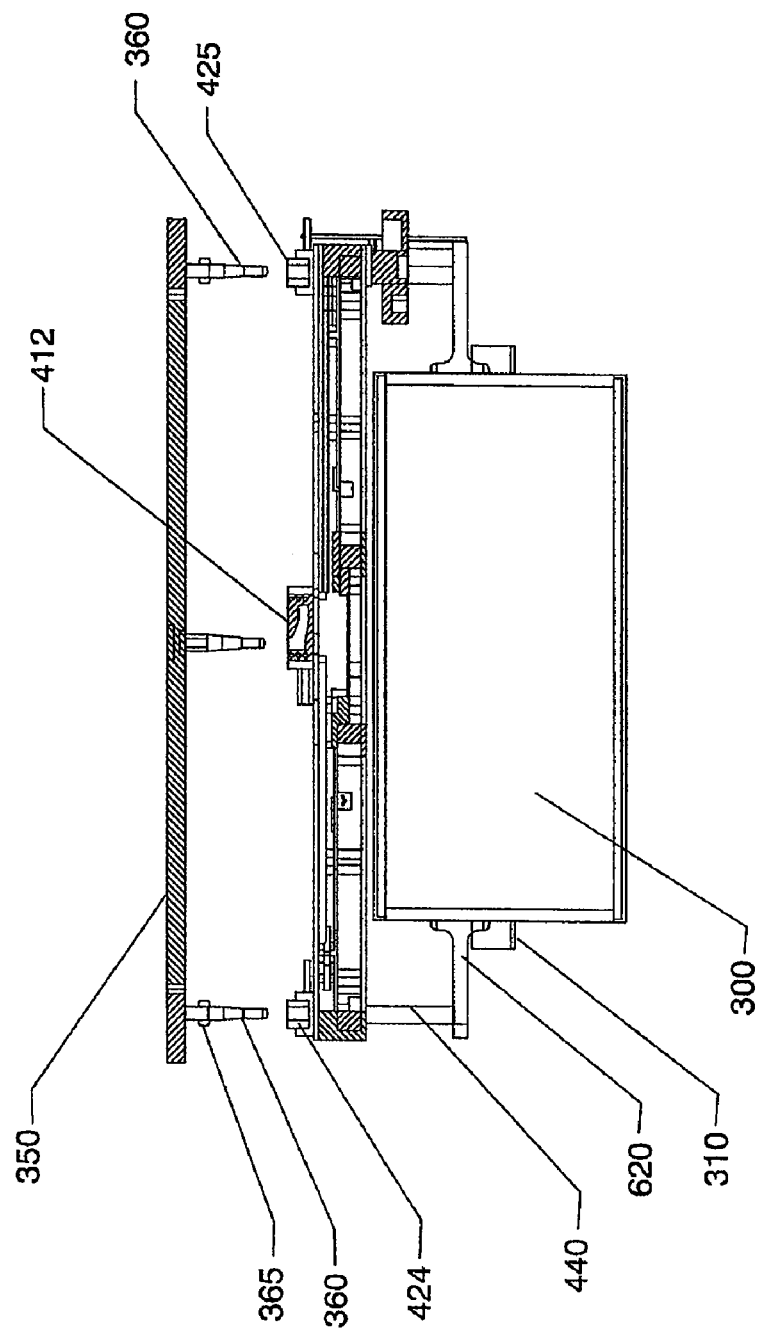
FIG. 13 is a cut-away, side view along line 13-13 of FIG. 12 showing a peripheral docking plate and a U-frame mounted on a test head.

FIG. 13 is a cut-away side view along line 13-13 of FIG. 12 of the peripheral docking plate 350 and U-frame 401 mounted on test head 300 in a pre-dock position. The plurality of alignment features 360, attached to peripheral mounting plate 401, are aligned with corresponding left 424, right 425 and center 412 linear cams attached to U-frame 401. When alignment features 360 are initially mated with the linear cams and their respective cam followers 365 (described below with respect to FIG. 14) are seated within the cams at the start of their respective sloping cam grooves 701, the docking apparatus is at the "ready to actuate" position.

Figure 14:
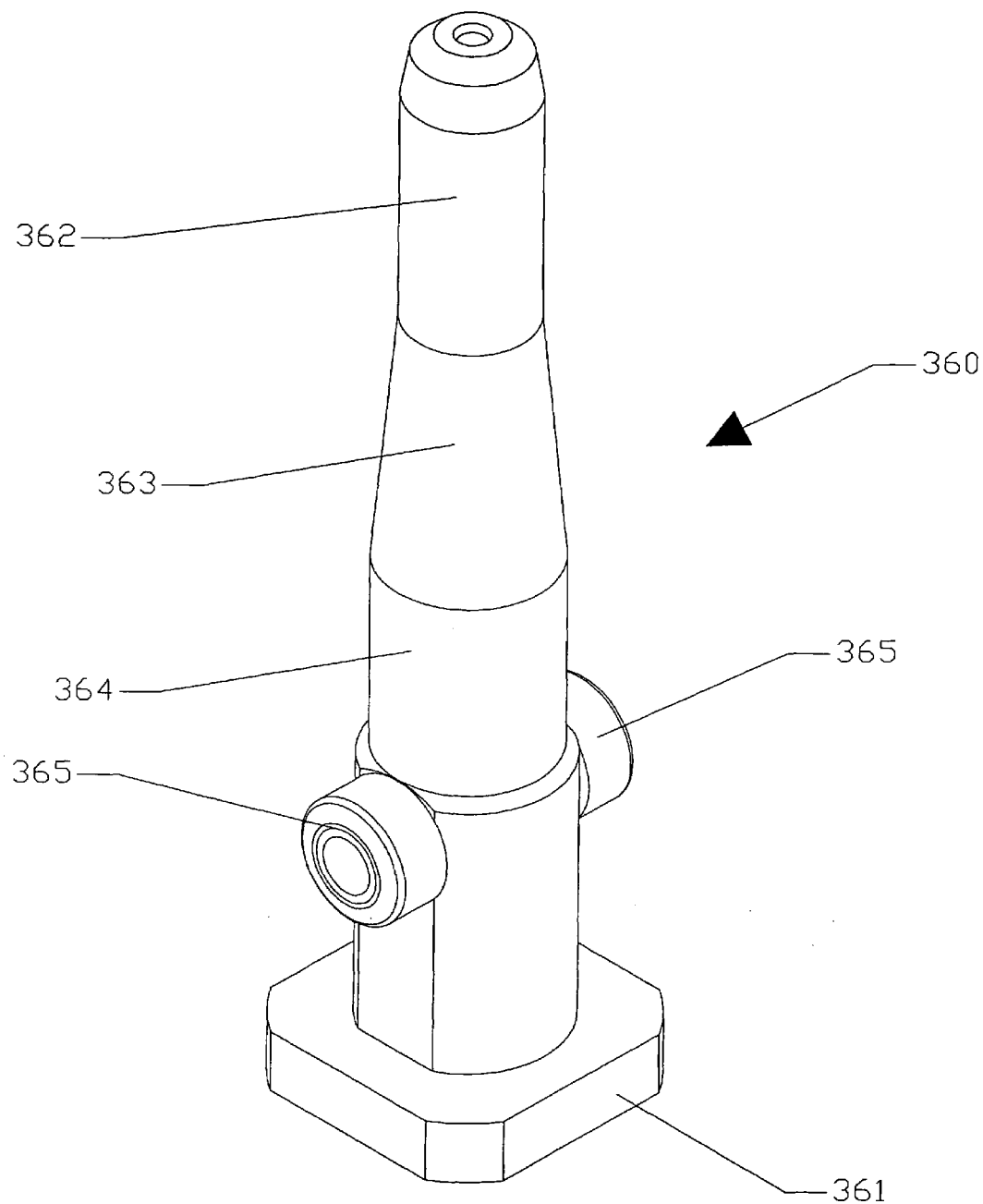
FIG. 14 is an enlarged perspective view of an alignment feature of a peripheral docking plate as shown in FIG. 13.

FIG. 14 is an enlarged perspective view of one alignment feature 360 of a peripheral docking plate shown in FIG. 13. Alignment feature 360 includes a base 361 with sections 362, 363 and 364 extending therefrom. As shown, sections 362 and 364 are of different diameters; and section 363 is tapered between them. In an exemplary embodiment, section diameters become increasingly narrow approaching the tip of alignment feature 360. This is particularly useful when docking a test head with a peripheral device because the small diameter section 362 relative to other sections 363 and 364 allows for greater initial error when inserting alignment features 360 into cam assemblies 700. Alignment features 360 include cam followers 365, which extend from the sides of alignment features 360. Cam followers 365 engage appropriate grooves 701 which are formed in left 424, right 425 and center 412 linear cams.

Figure 15:
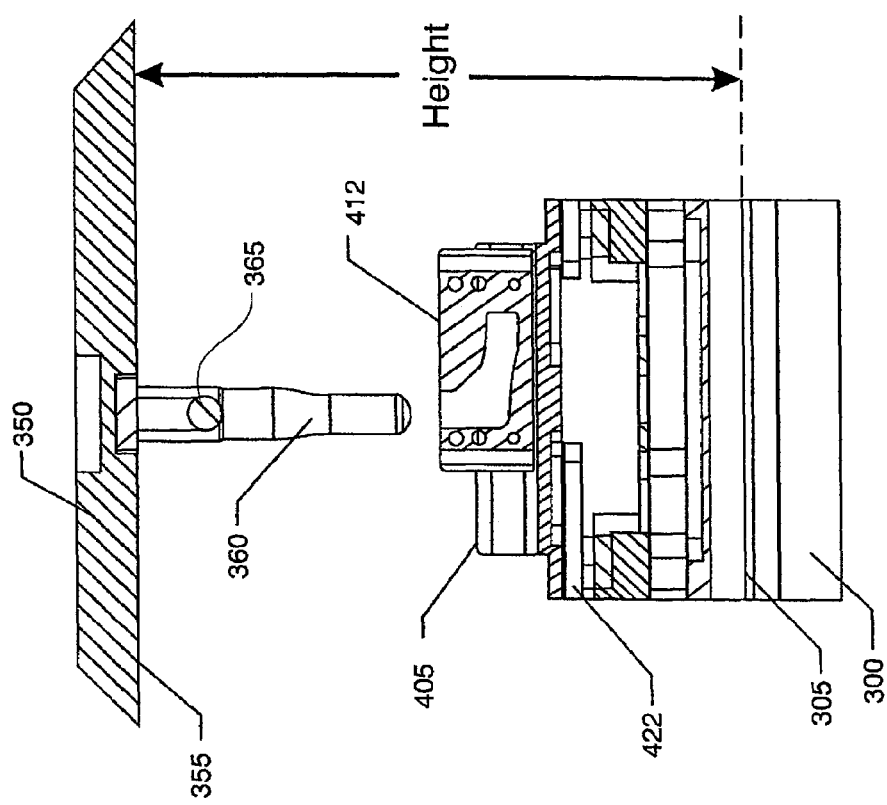
FIG. 15 is an enlarged, cut-away side view along line 13-13 of FIG. 12 showing a cam assembly of the U-frame in a pre-docking position.
Figure 16:
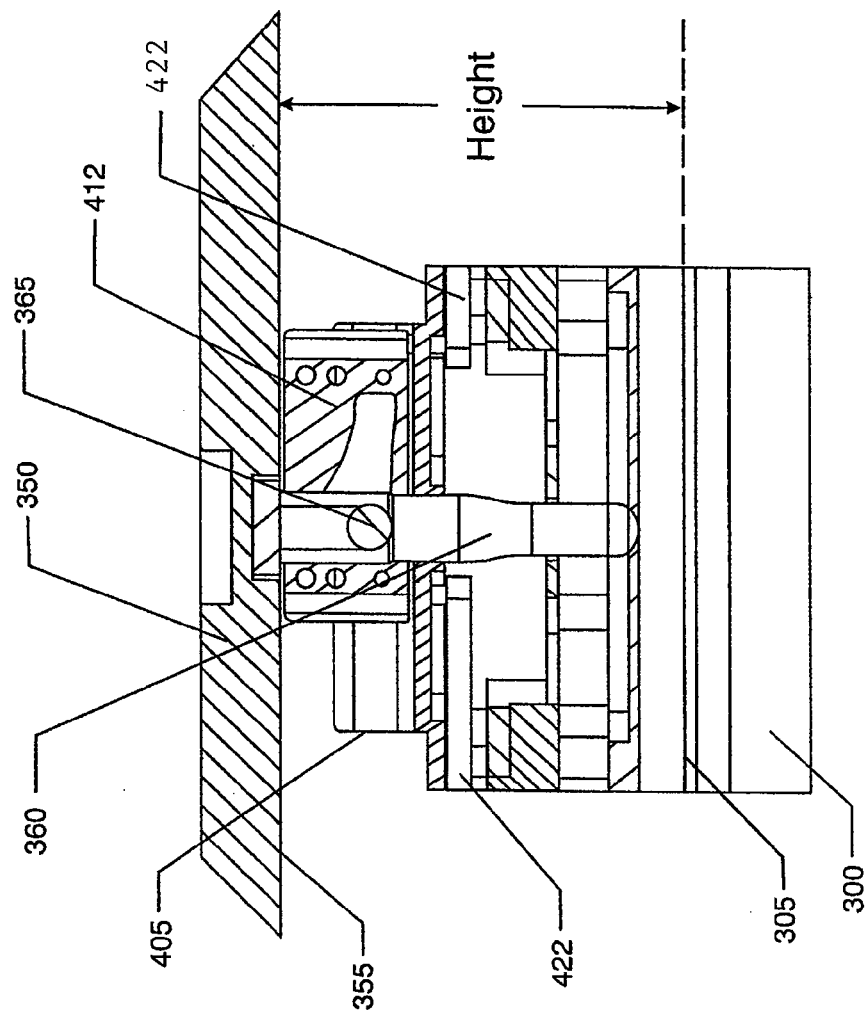
FIG. 16 is an enlarged, cut-away side view along line 13-13 of FIG. 12 showing an alignment feature and a cam assembly mated in the "ready to actuate" position.

FIG. 15 is an enlarged cut-away side view along line 13-13 of FIG. 12 showing alignment feature 360 and a cam assembly 700 of U-frame in a pre-docking position. Alignment feature 360 is aligned with linear cam 412 mounted to cam guide 405. FIG. 15 also indicates "height" which, here, refers to the distance between peripheral docking plate interface surface 355 and test head surface 305. FIG. 16 is another enlarged cut-away side view along line 13-13 of FIG. 12 showing alignment feature 360 mated with linear cam assembly 412. At this position the peripheral docking plate interface surface 355 and U-frame 401 are in the "ready-to-actuate position." FIG. 17 is an enlarged cut-away side view along line 13-13 of FIG. 12 showing alignment feature 360 in linear cam 412 at the docked position.

More generally, the operations of the docking apparatus of the present invention will be described by way of an exemplary embodiment in accordance with the present invention.

Referring to FIG. 1, a peripheral docking plate 350 is coupled to a peripheral (not shown). U-frame 401 is mounted to test head 300. Depending on the interface utilized between the peripheral and test head 300, U-frame 401 is set to a desired height in relation to test head surface 305. This height is carefully determined so as to establish a desired distance between the test head surface and the peripheral as previously described. As further discussed below, by adjusting the height of U-frame 401 with hand wheel 426, the desired height may be established before docking.

As FIG. 3 and in more detail FIGS. 4 and 5A show, the U-frame height is adjusted by turning hand wheel 426. Hand wheel 426 is coupled to a dual pulley 410. As hand wheel 426 turns, dual pulley 410 turns. Likewise as dual pulley 410 turns, drive nuts 411 also turn because they are connected to dual pulley 410 by way of a drive belt system (FIG. 4). Drive nuts 411 engage threaded members 440 in such a manner that when drive nuts 411 turn, they travel along threaded member 440. Because threaded members 440 are mounted essentially parallel to the sides of test head 300, the location of U-frame 401 compared to the test head surface 305 can be adjusted.

Indexing system 550 performs two functions. First it serves to lock U-frame 401 in position (the "index position"); and second it enables U-frame 401 to be returned to the required position in the event that its position had been changed (for example for maintenance). Thus, it allows the U-frame height to be set and locked at a predetermined height, then moved from that height, and finally brought back to the predetermined height without the need to reestablish the tediously calculated distance between the test head surface and the peripheral. To establish an index position of U-frame 401, referring now to FIG. 8, U-frame 401 is set to the desired predetermined position by turning hand wheel 426. Then, with securing screws 558 loosened, detent plate 556 is moved along slotted plate 553 so that detent 601 can engage lever 545 attached to U-frame 401 by way of pivot mount 554. Detent plate 556 may then be firmly secured to slotted plate 553 by tightening detent plate securing screws 558. Referring now to FIG. 9, once lever 545 is engaged with detent 601, the other end of lever 545 is engaged to sprocket wheel 544 by way of engaging pin 603. Engaging pin 603 of lever 545 prevents hand wheel 426 from turning and thus maintaining U-frame 401 at the index position. Spring 605 provides a force to maintain lever 545 in this position. To remove U-frame 401 from the index position, the engaging pin-end of lever 545 is drawn away from sprocket wheel 544. Because lever 545 is maintained on a pivot by pivot block 544, the detent-end of lever 545 is also drawn away from detent 601 of detent plate 556. Disengaging engaging pin 603 from sprocket wheel 544 allows hand wheel 426 to turn and thus allows U-frame to move along threaded members 440.

In the foregoing embodiment, hand wheel 426 is responsible for imparting movement to the pulley system which turns nut drive 411 and allows U-frame 401 to travel along threaded members 440. As understood by one of ordinary skill in the art however, hand wheel 426 may be replaced by other devices to cause the desired movement. For example spring driven, electrical or pneumatic drive mechanisms could be used. Such alternatives might be controlled either manually, by way of push buttons for example, or automatically, by way of a computer or controller for example. Numerous other manual means could be employed, for example, ratchet mechanisms.

Again referring to an exemplary embodiment according to the present invention, once an index position is established, peripheral docking plate 401 is now ready to be docked with U-frame 401. As indicated in FIG. 15, in the pre-dock position, alignment features 360 are aligned with the linear cams. According to the present embodiment, the tapered ends of alignment features 360 allow for slight misalignment when initially inserting alignment features 360 into linear cams.

As shown in FIG. 16, the alignment features 360 are mated with the linear cams in a "ready-to-actuate" position. The distance between test head surface 305 and the peripheral docking plate 350 at the "ready to actuate" position brings the fragile electrical connections into very close proximity; however the electrical connections are not yet established.

Actuating the linear cams by turning the docking activation handles 433 sets test head 300 in the final docked position. Referring to FIGS. 16 and 17, at the "ready to actuate" position, cam followers 365 of alignment features 360 are set into angled cam groves in the linear cams. To dock, the docking actuation handles 432 are rotated so that the linear cams are moved along cams guides 405. As a result, cam follower 365 slides along the angled groove in the linear cams drawing test head 300 into final docked position thereby exactly mating the hundreds or thousands of delicate electrical contacts between the two sides of the interface. In the foregoing embodiment, movement of the linear cams along the cam guides was actuated manual actuation handles. As understood by one of ordinary skill in the art however, the movement of the linear cams along the cam guides may be replaced by other means. More generally, the alignment features and dock actuation mechanisms incorporated in the exemplary embodiment are guide pins and receptacles combined with linear cams driven by levers and fixed links. Those skilled in the art will recognize that there are many alternative solutions in the field of test head docking. These include, but are not limited to: kinematic alignment features; gussets located in relationship to cams to provide initial alignment; circular cams instead of linear cams; cams operated by cables instead of rigid links, and electromagnetic, pneumatic, or vacuum driven or assisted actuation drivers.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. Apparatus for establishing a distance between a test head having test head electrical contacts and a peripheral having peripheral electrical contacts, comprising
   a plurality of alignment features which are coupled to one of said test head and said peripheral; and
   a plurality of linear units coupled to the other of said test head and said peripheral for causing movement of at least one of respective docking surfaces of said test head and said peripheral towards and away from each other,
   an actuating member which, when actuated, causes actuation of said plurality of linear units to cause said movement of said respective docking surfaces,
   said alignment features and said linear units preventing said test head and said peripheral from being closer to each other than a docked distance,
   wherein, at said docked distance, said test head electrical contacts and said peripheral electrical contacts are in contact with each other; and
   a sliding unit for
   a) changing position of said linear units relative to said other of said test head and said peripheral or
   b) changing position of said alignment features relative to said one of said test head and said peripheral
   in order to change said docked distance.

2. Apparatus for establishing a distance between a test head and a peripheral according to claim 1, wherein said one of said test head and said peripheral is coupled to said alignment features for docking said one of said test head and said peripheral with said other of said test head and peripheral.

3. Apparatus for establishing a distance between a test head and a peripheral according to claim 1, wherein one of said linear units includes one of a male and female threaded member attached to the other of said test head and peripheral.

4. Apparatus for establishing a distance between a test head and a peripheral according to claim 3, wherein one of said alignment features includes the other of said male and said female member threaded member.

5. Apparatus for establishing a distance between a test head and a peripheral according to claim 3, wherein said one of said male and female threaded member is rotated in order to move said alignment features towards or away from said docking surface of the other of said test head and said peripheral.

6. Apparatus for establishing a distance between a test head and a peripheral according to claim 4, wherein the other of said male and female member is rotated in order to move said alignment features towards or away from said docking surface of the other of said test head and said peripheral.

7. Apparatus for establishing a distance between a test head and a peripheral according to claim 1, wherein one of said linear units is coupled to a detent plate having a detent, said detent plate is coupled to the other of said test head and said peripheral, a lever is coupled to one of said alignment features and said lever engages said detent to indicate said frame is in an intended position relative to the other of said test head and said peripheral.

8. Apparatus of claim 1, wherein said linear units are for moving said frame.

9. Apparatus of claim 7, wherein said detent is one of a plurality of detents for indicating a respective plurality of intended positions of said one of said plurality of alignment features relative to the other of said test head and said peripheral.

10. Apparatus of claim 8, wherein a crank is rotated to cause said plurality of linear units to move said frame.

11. Apparatus of claim 1, wherein said docking surface is between said plurality of alignment features and said one of said test head and said peripheral.

12. Method for establishing a distance between a test head having test head electrical contacts and a peripheral having peripheral electrical contacts, comprising:
    providing a plurality of alignment features which are coupled to one of said test head and said peripheral and which is are detached from the other of said test head and said peripheral; and
    actuating a plurality of actuators to adjust said pluralitv of alignment features towards or away from a docking surface of said one of said test head and said peripheral to change said distance,
    wherein said plurality of alignment features prevent said test head and said peripheral from being closer to each other than said distance, and, at said distance, said test head electrical contacts and said peripheral electrical contacts are in contact With each other.

13. Method according to claim 12, wherein said one of said test head and said peripheral is coupled to said alignment features for docking said one of said test head and said peripheral with said other of said test head and peripheral.

14. Method according to claim 12, wherein said actuating step includes the actuation of a linear unit, said linear unit is one of a male and female threaded member attached to the other of said test head and peripheral.

15. Method according to claim 14, wherein one of said alignment features includes the other of said male and said female member threaded member.

16. Method according to claim 14, wherein said one of said male and female threaded member is rotated in order to move one of said alignment features towards or away from said docking surface of the other of said test head and said peripheral.

17. Method according to claim 15, wherein the other of said male and female member is rotated in order to move said one of said alignment features towards or away from said docking surface of the other of said test head and said peripheral.

18. Method according to claim 12, wherein one of said actuators actuates said linear unit which is coupled to a detent plate having a detent, said detent plate is coupled to the other of said test head and said peripheral, a lever is coupled to one of said alignment features, and said lever engages said detent to indicate said one of said alignment features is in an intended position relative to the other of said test head and said peripheral.

19. Method according to claim 12, wherein said actuators are for moving said frame.

20. Method according to claim 19, wherein a crank is rotated to cause movement of said frame.

21. Method according to claim 12, wherein said docking surface is between said plurality of actuators and said one of said test head and said peripheral.

22. Method according to claim 18, wherein said detent is one of a plurality of detents for indicating a respective plurality of intended positions of said one of said actuators relative to the other of said test head and said peripheral.

23. Apparatus according to claim 1, further comprising:
   a guide coupled to the other of said test head and said peripheral;
   said guide and one of said alignment features are separated prior to movement of at leastone of said docking surfaces;
   said guide engaging said one of said alignment features at said distance.

24. Method according to claim 12, said method further comprising the steps of:
   providing a guide coupled to the other of said test head and said peripheral so that said guide and one of said alignment features are separated prior to said adjustable movement of at least one of said docking surfaces; and
   allowing said guide to engage said one of said alignment features at said distance.

* * * * *